(12) United States Patent
Kam

(10) Patent No.: US 7,791,974 B2
(45) Date of Patent: Sep. 7, 2010

(54) RECOVERY OF EXISTING SRAM CAPACITY FROM FUSED-OUT BLOCKS

(75) Inventor: Jin Ming Kam, Perak (MY)

(73) Assignee: Intel Corporation, Santa Clara, CA (US)

( * ) Notice: Subject to any disclaimer, the term of this patent is extended or adjusted under 35 U.S.C. 154(b) by 338 days.

(21) Appl. No.: 12/059,225

(22) Filed: Mar. 31, 2008

(65) Prior Publication Data

US 2009/0245005 A1 Oct. 1, 2009

(51) Int. Cl.
*G11C 17/18* (2006.01)
(52) U.S. Cl. ............... 365/225.7; 365/230.05
(58) Field of Classification Search ............ 365/225.7, 365/230.05
See application file for complete search history.

(56) References Cited

U.S. PATENT DOCUMENTS

| | | | | |
|---|---|---|---|---|
| 5,889,679 A | * | 3/1999 | Henry et al. | 716/17 |
| 7,065,686 B2 | * | 6/2006 | Endo et al. | 714/718 |
| 7,340,658 B2 | * | 3/2008 | Seuring | 714/726 |
| 7,680,968 B2 | * | 3/2010 | Burton | 710/62 |
| 7,693,596 B2 | * | 4/2010 | Sauber et al. | 700/121 |

* cited by examiner

*Primary Examiner*—VanThu Nguyen
(74) *Attorney, Agent, or Firm*—Derek J. Reynolds

(57) ABSTRACT

A system includes an interconnect within an integrated circuit, and a first fuse-disabled design block within the integrated circuit that has an internal static random access memory (SRAM). The first fuse-disabled design block is coupled to the interconnect. The system also includes a memory controller that is coupled to the interconnect. The memory controller is capable of selecting the internal SRAM and allocating the internal SRAM for storage accessible by one or more devices external to the first fuse-disabled integrated peripheral.

20 Claims, 4 Drawing Sheets

| A | B | C | D | E |
|---|---|---|---|---|
| Design Block 1 SRAM | DB1 Fuse Setting | DB1 SRAM Size | DB1 Start Address | DB1 End Address |
| Design Block 2 SRAM | DB2 Fuse Setting | DB2 SRAM Size | DB2 Start Address | DB2 End Address |
| ... | ... | ... | ... | ... |
| Design Block N SRAM | DBN Fuse Setting | DBN SRAM Size | DBN Start Address | DBN End Address |

FIG. 2

| Address Range | Device |
|---|---|
| 00000000 – 1FFFFFFF | System Memory |
| 20000000 – 2FFFFFFF | Expansion |
| 30000000 – ???????? | Internal SRAM |
| ???????? – 7FFFFFFF | Reserved |
| ... | ... |
| F0000000 – FFFFFFFF | PCIe Host 2 |

FIG. 3

| A | B | C | D | E |
|---|---|---|---|---|
| Design Block | Fuse Setting | SRAM Size | Start Address | End Address |
| USB Host 1 | On | 1k | XXXXXXXX | XXXXXXXX |
| USB Host 2 | Fused Out | 1k | 30000000 | 300003FF |
| PCIe Host 1 | Fused Out | 4k | 30000400 | 300013FF |
| PCIe Host 2 | On | 4k | XXXXXXXX | XXXXXXXX |

FIG. 4

| A | B | C | D | E |
|---|---|---|---|---|
| Design Block | Fuse Setting | SRAM Size | Start Address | End Address |
| USB Host 1 | Fused Out | 1k | 30000000 | 300003FF |
| USB Host 2 | Fused Out | 1k | 30000400 | 300007FF |
| PCIe Host 1 | On | 4k | XXXXXXXX | XXXXXXXX |
| PCIe Host 2 | Fused Out | 4k | 30000800 | 300017FF |

FIG. 5

RECOVERY OF EXISTING SRAM CAPACITY FROM FUSED-OUT BLOCKS

FIELD OF THE INVENTION

The invention relates to the recovery of existing SRAM capacity from fused-out design blocks within an integrated circuit.

BACKGROUND OF THE INVENTION

Modern, multipurpose integrated circuits generally have a number of independently functioning units. These units are sometimes referred to as integrated peripheral devices or design blocks. For example, a design block may be a Universal Serial Bus (USB) host controller or a PCI Express® (PCIe) host controller. Integrated circuit manufacturing companies, to keep manufacturing costs down, might design an integrated circuit that has several design blocks and distinguish between different product models (i.e. different stock keeping units (SKUs)) by "fusing-out" one or more design blocks on a certain percentage of the manufactured units. When a design block is fused-out it is permanently disabled.

When there are a large number of design blocks in a product that are fused-out, a significant portion of the physical die space of the integrated circuit is not available for use (i.e. all the fused-out design blocks lie dormant). Many of these design blocks have internal static random access memory (SRAM) for use by the block. When a block is fused-out, the SRAM that was implemented specifically for the block is also disabled. Thus, otherwise usable SRAMs go unutilized in these scenarios.

BRIEF DESCRIPTION OF THE DRAWINGS

The present invention is illustrated by way of example and is not limited by the drawings, in which like references indicate similar elements, and in which:

FIG. 2 illustrates an embodiment of the general makeup of a memory allocator table utilized by the address allocator unit.

FIG. 3 illustrates an embodiment of a system memory map that includes the internal SRAM address range.

FIG. 4 illustrates a first example of the memory allocator table utilized by the address allocator unit.

FIG. 5 illustrates a second example of the memory allocator table utilized by the address allocator unit.

DETAILED DESCRIPTION OF THE INVENTION

Embodiments of a system, device, and method to recover existing static random access memory (SRAM) capacity from fused-out blocks are disclosed. In general, a modified memory controller that has added capacity to access and allocate SRAMs in fused-out design blocks is described. The SRAMs in the system are dual-port SRAMs, which allow standard access to the memory from logic within the design block the SRAM is integrated within as well as alternate access to the memory from logic elsewhere in the system. Specifically, the memory controller can select SRAMs from fused-out design blocks, allocate the SRAM memory locations using a memory allocator table, and provide the newly allocated SRAM memory for use by the system through a system memory map.

Reference in the following description and claims to "one embodiment" or "an embodiment" of the disclosed techniques means that a particular feature, structure, or characteristic described in connection with the embodiment is included in at least one embodiment of the disclosed techniques. Thus, the appearances of the phrase "in one embodiment" appearing in various places throughout the specification are not necessarily all referring to the same embodiment.

In the following description and claims, the terms "include" and "comprise," along with their derivatives, may be used, and are intended to be treated as synonyms for each other. In addition, in the following description and claims, the terms "coupled" and "connected," along with their derivatives may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

Figure 1:
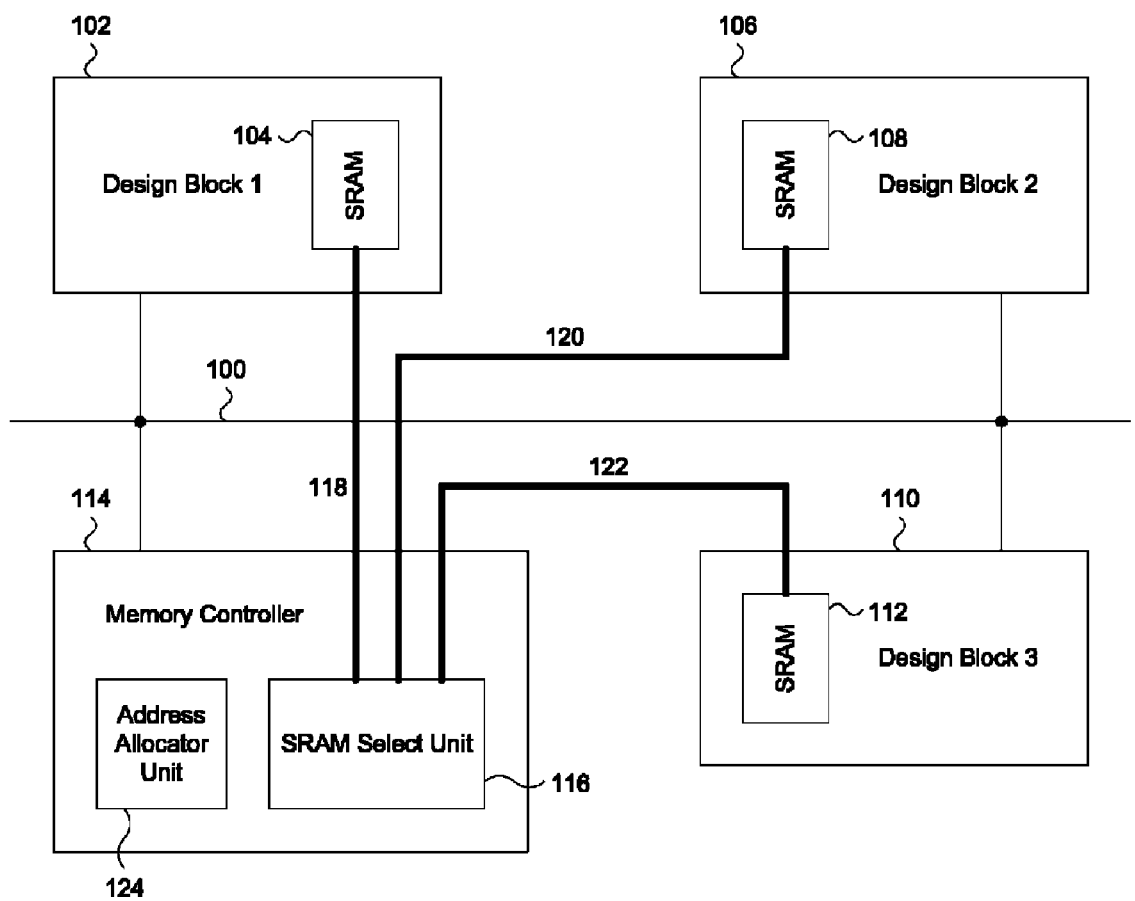
FIG. 1 describes an embodiment of a system to recover existing SRAM capacity from the fused-out blocks of an integrated circuit.

FIG. 1 describes an embodiment of a system to recover existing SRAM capacity from the fused-out blocks of an integrated circuit. The system includes an interconnect 100 within an integrated circuit. In many embodiments, the interconnect is an internal backbone interconnect that allows communication between one or more processors (not shown), one or more design blocks, and one or more memory controllers. In different embodiments, a design block may be an I/O host controller, such as a USB host controller or a PCIe host controller, or another integrated peripheral. In many embodiments, the system is a system-on-a-chip (SoC) design, which includes at least one processor and multiple peripherals on the same silicon die.

In many embodiments, one or more of the peripherals (i.e. design blocks) each contain a large SRAM array. For example, design block 1 (102) includes SRAM 104, design block 2 (106) includes SRAM 108, and design block 3 (110) includes SRAM 112. For ease of explanation, design block 1 (102) and SRAM 104 will be utilized for general example purposes, but it should be readily apparent that both of the other two design blocks (106 and 110) as well as SRAMs 108 and 112 could be also utilized in the SRAM recovery scheme. When design block 1 (102) is not fused-out (i.e. when it is functional), logic within the design block may utilize SRAM 104 for operational purposes. This may include standard operations that are required of the design block, including being utilized for internal storage and buffers. On the other hand, when design block 1 (102) is fused-out (i.e. when it is non-functional), the logic within the design block is permanently dormant and therefore, the internal logic would not utilize SRAM 104.

Thus, in many embodiments SRAM 104 is a dual-ported SRAM. Each port includes separate clock and control signals, to allow SRAM 104 to interact with two separate communication interfaces. In many embodiments, only one port is active at a given time. For example, if design block 1 (102) is not fused-out, then logic within the design block 1 (102) will have full control over SRAM 104 through a first port. Otherwise, if design block (102) is fused-out, then memory controller 114 will have full control over SRAM 104 through a second port.

In many embodiments, memory controller 114 is coupled to internal interconnect 100. In some embodiments, interconnect 100 can transmit the clock and control signals from memory controller 114 to the second port in SRAM 104 within design block 1 (102). In other embodiments (not shown), a separate set of interconnect lines are utilized to transmit the clock and control signals from the memory controller 114.

The specific implementation for how to "fuse-out" a design block can be accomplished in a number of ways. In some embodiments, a fuse per design block is located within the silicon die that includes design blocks 1-3. In other embodiments, a fuse per design block is located elsewhere within a computer system such as in a system management controller. The fuses are not shown in FIG. 1.

When a design block is not fused-out, the block is functional and logic within the block controls the SRAM that is within the block. The logic within the block can perform memory reads and writes to locations within the SRAM. Additionally, logic external to the block does not have control over the SRAM. Rather, logic outside of the block can communicate specifically with logic inside of the block across interconnect 100, but not directly with the SRAM.

When a design block is fused-out, the block, including internal block logic, is non-functional. Thus to select and activate a specific SRAM for use, the memory controller 114 includes a SRAM select unit 116. The SRAM select unit 116 selects an SRAM based on the address being used to target an SRAM, which will fall within the address range allocated for a specific SRAM. For example, if SRAM 104 has been allocated memory addresses in the range of 30000000-300003FF and a memory location in that ranged is being accessed, the SRAM select unit 116 will select SRAM 104 to be used by pulling the SRAM select line 118 signal high (i.e. pulling the line from a logical zero to a logical one). In other examples, if the memory location is in the range of the allocated address space for SRAM 108 or SRAM 112, then SRAM select line will pull the SRAM select line 120 signal or the SRAM select line 122 signal high, respectively.

In many embodiments, memory controller 114 includes an address allocator unit 124. The address allocator unit 124 maintains a memory allocator table (shown in detail in FIG. 2). The memory allocator table maintains information as to the sizes of each SRAM (e.g. SRAM 104, SRAM 108, and SRAM 112) as well as the fuse information for each SRAM. Using the fuse information, the address allocator unit 124 can allocate addresses within SRAMs into a contiguous memory space residing in the overall system memory map. The system memory map is shown in detail in FIG. 3. In many embodiments, the address allocator unit 124 allocates SRAM address space within the system memory map during boot by reading the fuse settings and sizes of each SRAM and allocating memory locations accordingly.

FIG. 2 illustrates an embodiment of the general makeup of a memory allocator table utilized by the address allocator unit. In some embodiments, the memory allocator table is stored locally within the memory controller. In other embodiments, the memory allocator table is stored elsewhere in the system.

Column A of the table identifies the specific design block SRAM. In some embodiments, there is one SRAM per design block. In other embodiments (not shown), there are multiple SRAMs in one or more of the design blocks. In other embodiments (not shown), some design blocks do not contain SRAMs.

Column B stores the fuse setting for each design block. Again, the fuse setting for a design block will determine whether the design block is functional or non-functional (i.e. fused-out).

Column C stores the size of each design block SRAM. The size can be in bytes, kilobytes, or another standard size unit. Different SRAMs referenced in the table may have different sizes, this is illustrated specifically in memory allocator table examples in FIGS. 4 and 5.

Columns D and E store the start and end allocated address within the system memory map for each SRAM. The start and end addresses per SRAM may be determined at system boot. This information can be determined based on the start of the address range for all internal SRAMs, the fuse setting for each SRAM, and the size of each SRAM.

FIG. 3 illustrates an embodiment of a system memory map that includes the internal SRAM address range. For example, system memory may be allocated addresses in the 00000000-1FFFFFFF range. Expansion devices may then be allocated addresses in the 20000000-2FFFFFFF range. At this point in the system map, the Internal SRAM devices may have their address range allocated. In general, 30000000-7FFFFFFF is a reserved range of addresses. In many embodiments, the Internal SRAMs may utilize a contiguous address space starting from the beginning of the reserved range (30000000) and ending at an address in the range that corresponds to the sum of the sizes of all fused-out SRAMs above 30000000.

For example, if there are three fused-out SRAMs to utilize and each of the three has a 1 kilobyte size (1 k or 400 in hexadecimal address space), then the total address space utilized would be 30000000-30000BFF. Then the remainder of the address space, 30000C00-7FFFFFFF, would be reserved. In other embodiments the Internal SRAMs may utilize a contiguous address space elsewhere in the reserved range, not starting at the beginning of the reserved range, but at some address location within the 30000000-7FFFFFFF range. Addresses above 7FFFFFFF would fill out as normal, such as for example, PCIe Host 2 having the range of F0000000-FFFFFFFF.

FIG. 4 illustrates a first example of the memory allocator table utilized by the address allocator unit. In this example, there are four design blocks, each with one internal SRAM. The first design block is USB Host 1 and it has not been fused-out (i.e. it is functional). Thus, although there is a 1 k SRAM within the first design block, it is not allocated any address range in the system memory map because that SRAM is utilized by logic internally within USB Host 1.

The second design block is USB Host 2 and it has been fused-out (i.e. it is non-functional). Thus, this SRAM is allocated an address range in the system memory map. Additionally, this SRAM is 1 k in size and so the start address in the system memory map is 30000000 and the end address is 300003FF.

The third design block is PCIe Host 1 and it has been fused-out. Thus, this SRAM is allocated an address range in the system memory map. Additionally, this SRAM is 4 k in size and so the start address in the system memory map is 30000400 (which is the first address after the end of the USB Host 2 range of allocated addresses) and the end address is 300013FF.

The fourth design block is PCIe Host 2 and it has not been fused-out. So, again, although there is a 4 k SRAM within the fourth design block, it is not allocated any address range in the system memory map because that SRAM is utilized by logic internally within PCIe Host 2.

FIG. 5 illustrates a second example of the memory allocator table utilized by the address allocator unit. Similarly to FIG. 4, in this example, there are four design blocks, each with one internal SRAM. The first design block is USB Host 1 and it has been fused-out. Thus, this SRAM is allocated an address range in the system memory map. Additionally, this SRAM is 1 k in size and so the start address in the system memory map is 30000000 and the end address is 300003FF.

The second design block is USB Host 2 and it has been fused-out. Thus, this SRAM is allocated an address range in the system memory map. Additionally, this SRAM is 1 k in size and so the start address in the system memory map is 30000400 (the first address after the end of the USB Host 1 range of allocated addresses) and the end address is 300007FF.

The third design block is PCIe Host 1 and it has not been fused-out. So, although there is a 4 k SRAM within the third design block, it is not allocated any address range in the system memory map because that SRAM is utilized by logic internally within PCIe Host 1.

The fourth design block is PCIe Host 2 and it has been fused-out. Thus, this SRAM is allocated an address range in the system memory map. Additionally, this SRAM is 4 k in size and so the start address in the system memory map is 30000800 (the first address after the end of the USB Host 2 range of allocated addresses) and the end address is 300017FF.

Figure 6:
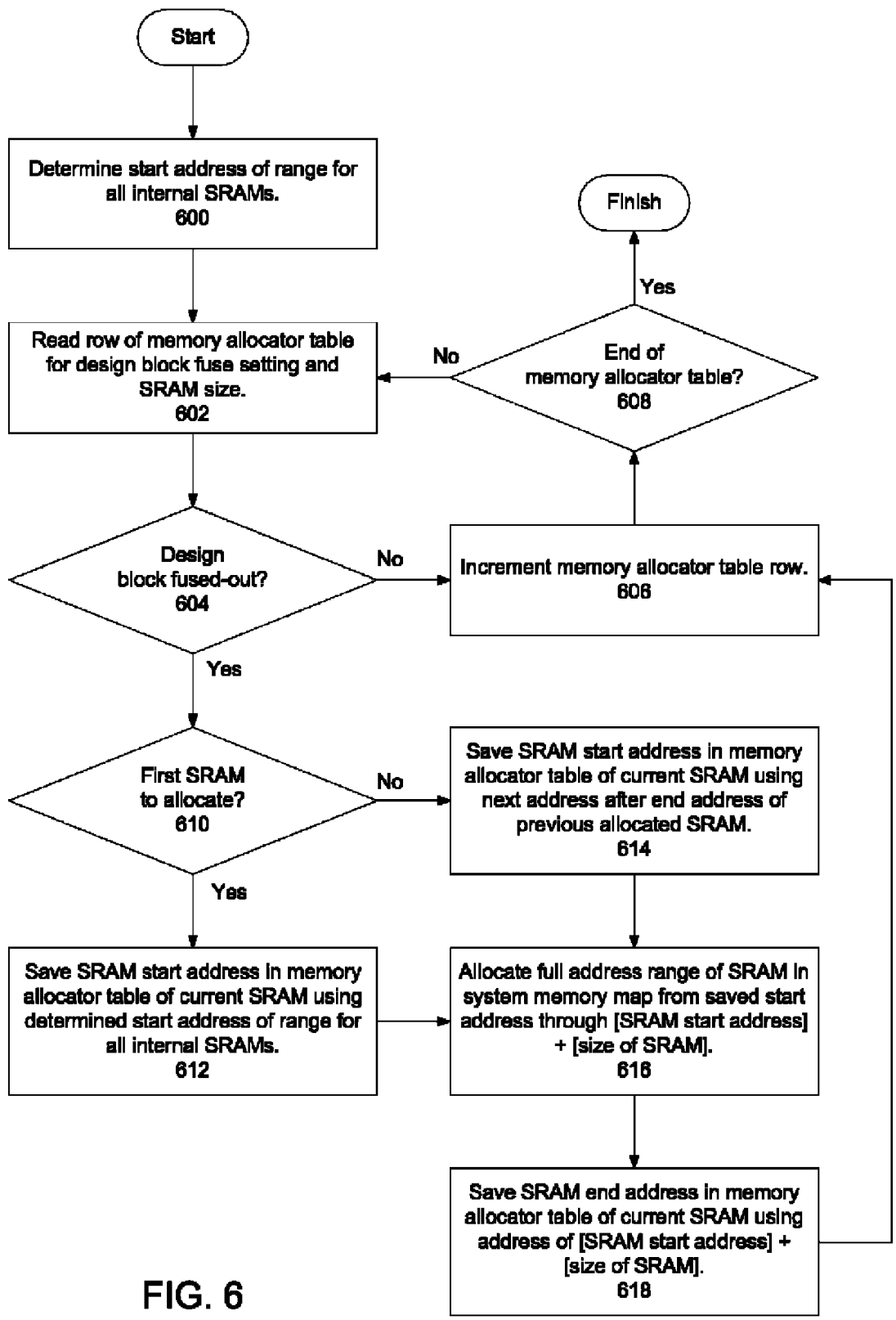
FIG. 6 is a flow diagram of one embodiment of a process to recover existing SRAM capacity from the fused-out blocks of an integrated circuit.

FIG. 6 is a flow diagram of one embodiment of a process to recover existing SRAM capacity from the fused-out blocks of an integrated circuit. The process is performed by processing logic that may be comprised of hardware, software, or a combination of both. Turning now to FIG. 6, the process begins by processing logic determining the start address of the range for all internal SRAMs (processing block 600). In some embodiments, the start address of the range of all internal SRAMs can be determined once and remain permanently in the system memory map. For example, as FIG. 3 illustrated, the start address of all internal SRAMs may be 30000000.

Next, processing logic reads a row of the memory allocator table (starting from the beginning) to get the design block fuse setting and the SRAM size for that particular row (processing block 602). This information is discussed in detail in relation to FIG. 2.

Then processing logic determines whether the fuse setting shows that the design block identified by the row that was read in the memory allocator table is fused out (processing block 604). If the design block is not fused out, the processing logic increments memory allocator table to next row to continue the process (processing block 606). After the row has been incremented, processing logic determines whether the end of the memory allocator table has been reached (processing block 608). If the end has been reached, then the process is finished. Otherwise processing logic returns to processing block 602 and begins again by reading the current row in the memory allocator table.

Returning to processing block 604, if the design block is fused-out, then processing logic determines whether the SRAM is the first one to allocate memory space for (processing block 610). If this is the first SRAM to allocate, then processing logic saves the start address in the memory allocator table of the first SRAM using the determined start address of the range of all internal SRAMs (processing block 612). The start address of the range of all internal SRAMs was determined by processing logic at processing block 600. Otherwise, if this was not the first SRAM allocated, then processing logic saves the start address in the memory allocator table of the current SRAM by using the next contiguous address after the end of the previously allocated SRAM (processing block 614).

After either processing block 612 or 614, processing logic then allocates the full address range of SRAM in the system memory map from the saved SRAM start address through an address that is equal to the SRAM start address plus the size of the SRAM (processing block 616). Examples of the SRAM allocation are shown in detail in relation to FIGS. 4 and 5.

Then processing logic saves the SRAM end address in the memory allocator table of the current SRAM using the resulting address that equals the SRAM start address plus the size of the SRAM (processing block 616).

Processing logic then returns to processing block 606 to increment to next memory allocator table row and the process is finished.

Thus, embodiments of a system, device, and method to recover existing static random access memory (SRAM) capacity from fused-out blocks are disclosed. These embodiments have been described with reference to specific exemplary embodiments thereof. It will be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

What is claimed is:

1. A system, comprising:
   an interconnect within an integrated circuit;
   a first fuse-disabled design block within the integrated circuit, coupled to the interconnect, the first fuse-disabled design block having an internal static random access memory (SRAM);
   a memory controller, coupled to the interconnect, to
      select the internal SRAM; and
      allocate the internal SRAM for storage accessible by one or more devices external to the first fuse-disabled integrated peripheral.

2. The system of claim 1, wherein the internal SRAM is a dual-port SRAM.

3. The system of claim 2, wherein the internal SRAM is accessible from logic within the first fuse-disabled design block through one port and from logic within the memory controller through the other port.

4. The system of claim 3, wherein the internal SRAM is accessible through only one port at a given time.

5. The system of claim 1, wherein the integrated circuit includes one or more additional design blocks each with a disabling fuse and each with an additional internal SRAM.

6. The system of claim 5, wherein the memory controller further comprises an SRAM select unit to select the internal SRAM of the first design block among the plurality of internal SRAMs.

7. The system of claim 5, wherein the memory controller further comprises an address allocator unit to
   determine for each of the plurality of design blocks within the integrated peripheral whether the disabling fuse is blown; and
   allocate the address space of all SRAMs within design blocks that have blown enabling fuses to system memory space within a system memory map.

8. The system of claim 7, further comprising a memory allocator table to store an identifier for each SRAM, a fuse setting for each design block, a size of each SRAM, a start address for each SRAM, and an end address for each SRAM.

9. The system of claim 8, wherein the start address and end address for each SRAM are determined at system boot.

10. A memory controller device, comprising:
    a static random access memory (SRAM) select unit to select a first SRAM that is internal to a fuse-disabled design block within an integrated circuit; and
    an address allocation unit to allocate address space within the selected first SRAM to a system memory space within a system memory map usable by one or more devices external to the design block.

11. The device of claim 10, wherein the internal SRAM is a dual-port SRAM.

12. The device of claim 11, wherein the internal SRAM is accessible from logic within the first fuse-disabled design block through one port and from logic within the memory controller through the other port.

13. The device of claim 12, wherein the internal SRAM is accessible through only one port at a given time.

14. The device of claim 10, wherein the integrated circuit includes one or more additional design blocks each with a disabling fuse and each with an additional internal SRAM.

15. A method, comprising:
allocating at least a portion of a static random access memory (SRAM), located inside a fuse-disabled design block that is within integrated circuit, for use by one or more devices external to the design block.

16. The method of claim 15, wherein the internal SRAM is a dual-port SRAM.

17. The method of claim 16, wherein the internal SRAM is accessible from logic within the first fuse-disabled design block through one port and from logic within the memory controller through the other port.

18. The method of claim 17, wherein the internal SRAM is accessible through only one port at a given time.

19. The method of claim 18, wherein the integrated circuit includes one or more additional design blocks each with a disabling fuse and each with an additional internal SRAM.

20. The method of claim 19, further comprising:
determining for each of the plurality of design blocks within the integrated peripheral whether the disabling fuse is blown; and
allocating the address space of all SRAMs within design blocks that have blown enabling fuses to system memory space within a system memory map.

* * * * *